United States Patent
Lee et al.

(10) Patent No.: US 9,143,006 B2
(45) Date of Patent: Sep. 22, 2015

(54) ELECTRIC POWER SUPPLY APPARATUS OF ELECTRIC APPARATUS

(75) Inventors: Kyu Suk Lee, Suwon-si (KR); Hyun Soo Park, Seoul (KR); Young Jin Park, Bucheon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 891 days.

(21) Appl. No.: 13/396,802

(22) Filed: Feb. 15, 2012

(65) Prior Publication Data
US 2012/0235490 A1 Sep. 20, 2012

(30) Foreign Application Priority Data
Feb. 15, 2011 (KR) ........................ 10-2011-0013440

(51) Int. Cl.
*H02J 1/00* (2006.01)
*H02J 9/00* (2006.01)
*H02J 9/06* (2006.01)
*H02J 7/00* (2006.01)

(52) U.S. Cl.
CPC . *H02J 9/005* (2013.01); *H02J 9/06* (2013.01); *H02J 2007/004* (2013.01); *H03K 2217/0036* (2013.01); *Y10T 307/625* (2015.04)

(58) Field of Classification Search
CPC ....... H02J 9/005; H02J 9/06; H02J 2007/004; Y10T 307/625; H03K 2217/0036
USPC .......................................... 307/125, 126, 130
See application file for complete search history.

(56) References Cited

U.S. PATENT DOCUMENTS

| 2009/0300400 | A1* | 12/2009 | DuBose ........................ 713/340 |
| 2010/0201208 | A1* | 8/2010 | Berghegger et al. .......... 307/125 |
| 2011/0127854 | A1* | 6/2011 | Cruz et al. .................... 307/131 |
| 2012/0319488 | A1* | 12/2012 | Yu et al. .......................... 307/66 |

* cited by examiner

*Primary Examiner* — Daniel Cavallari
(74) *Attorney, Agent, or Firm* — Staas & Halsey LLP

(57) ABSTRACT

An electric power supply of an electric apparatus is provided. The electric power supply includes a low power supply unit configured to convert a voltage of an input alternating current (AC) power source and provide the converted voltage, a power storage unit configured to be charged by receiving the converted voltage from the low power supply unit and to provide the charged power as a standby power of the electric apparatus, a voltage detection unit configured to detect a level of voltage charged in the power storage unit, and a switch unit configured to allow the voltage of the low power supply unit to be supplied to the power storage unit, or to block the voltage of the low power supply unit from being supplied to the power storage unit according to the level of voltage charged in the power storage unit detected through the voltage detection unit.

16 Claims, 3 Drawing Sheets

ELECTRIC POWER SUPPLY APPARATUS OF ELECTRIC APPARATUS

CROSS-REFERENCE TO RELATED APPLICATION(S)

This application is related to and claims priority to Korean Patent Application No. 10-2011-0013440, filed on Feb. 15, 2011 in the Korean Intellectual Property Office, the disclosure of which is incorporated herein by reference.

BACKGROUND

1. Field

The embodiments discussed herein relate to an electric power supply apparatus capable of reducing a standby power that is provided to an electric apparatus.

2. Description of the Related Art

In general, a standby power represents an electric power consumed when an electric apparatus does not perform its primary function or waits for power-on signals from external and internal parts while being connected to an external power source (nominal alternating current (AC) power source).

In many cases, some electric apparatuses—such as a television, an air conditioner, a microwave, a computer, and a charger of a mobile phone—consume a greater amount of electric power in a standby mode than during the time that they are in an operating mode during a day. An example is a home microwave.

Such an electric apparatus performs a power-saving standby mode when they do not offer any feature while being connected to a commercial AC power source. However, the electric apparatus is not completely disconnected from the nominal power source and thus consumes, for example, several hundreds of milliwatts or several watts.

In particular, some electric apparatuses activated by a remote will control—a television, an air-conditioner, and an audio system, for example—need to provide a minimum amount of electric power to a control unit including a remote control signal receiver even when the electric apparatuses are switched off. In this manner, when a user controls a switched-off electric apparatus by use of a remote control, the electric apparatus can receive a remote control signal transmitted from the remote control, and performs a function corresponding to the received remote control signal.

Accordingly, electric apparatuses controlled by a remote control further generate a predetermined amount of standby power to receive a remote control signal in a standby mode.

Such a standby power users approximately 11% of domestic power consumption in Korea, and in order to reduce the standby power, a lot of government regulations come into force and many technologies have been developed.

One method to reduce the standby power is by use of a technology in which the efficiency of power source generated is enhanced when the voltage is converted in a transformer. Another method to reduce the standby power is by use of a technology in which standby power is provided by use of a subsidiary standby power supply apparatus other than an electric transformer.

According to the technology of enhancing the efficiency of power generated when converting the voltage of a transformer, an AC power source supplied from a commercial power source is rectified, and then the rectified power is provided to a transformer so that the voltage of the transformer is changed to a power by intermittently controlling the switching device; and therefore the converted power is used as a standby power.

Most of the standby power in an electric apparatus is mainly consumed by a remote control signal receiving circuit, which may be configured to receive a signal from a remote control to control the power of the electric apparatus, or from a control circuit, which may be configured to receive a signal of an external power button, when the electric apparatus is in a standby state. Although the amount of power consumption is very small, the efficiency of a Switched-Mode Power Supply (SMPS) used to provide the standby power is significantly lowered and thus a power loss at an internal transformer occurs. In this regard, a number of technologies have been developed to enhance the efficiency of the SMPS in the standby mode, but it is difficult to reduce the standby power to the level of several milliwatts.

According to the technology of providing the standby power by use of a subsidiary standby power supply apparatus other than an electric transformer, a power is charged in a subsidiary standby power supply apparatus, such as a secondary battery or a super-capacitor, and the charged power is used as the standby power in the standby mode.

In this case, the power stored in the standby power supply apparatus is used as the standby power in a standby mode state, so a standby power in a normal state can be removed. However, the amount of power stored in the secondary battery is limited, so the secondary battery needs to be recharged after a predetermined time period of the secondary battery's use. In addition, since the secondary battery is recharged by use of a power source of the SMPS, more power is consumed than it requires to be recharged.

In addition, if the secondary battery is not recharged, the secondary battery is completely discharged and thus the electric apparatus does not operate properly.

SUMMARY

It is an aspect of an exemplary embodiment of the present invention to provide an electric power supply apparatus of an electric apparatus capable of preventing a power from being wasted by providing a standby power by use of a power storage unit, such as a super capacitor, and if the voltage of the power storage unit is reduced to a predetermined level, charging the power storage unit—by connecting a power source—can provide a small, predetermined amount of power required in the power storage unit such that a minimum amount of standby power is generated.

It is another aspect of the present invention to provide an electric power supply apparatus of an electric apparatus capable of reducing the amount of standby power consumed when an electric apparatus in operation is disconnected from an external power source due to an abnormal condition, and then is recovered from the disconnection.

Additional aspects of the invention will be set forth in part in the description which follows and, in part, will be obvious from the description, or may be learned by practice of the invention.

In accordance with an aspect of the present invention, an electric power supply apparatus of an electric apparatus includes a low power supply unit, a power storage unit, a voltage detection unit and a switch unit. The low power supply unit may be configured to convert a voltage of an input alternating current (AC) power source and provide the converted voltage. The power storage unit may be configured to be charged by receiving the converted voltage from the low power supply unit and to provide the charged power as a standby power of the electric apparatus. The voltage detection unit may be configured to detect a level of voltage charged in the power storage unit. The switch unit may be configured to allow the voltage of the low power supply unit to be supplied to the power storage unit, or to block the voltage of the low power supply unit from being supplied to the power storage unit according to the level of voltage charged in the power storage unit detected through the voltage detection unit.

The low power supply unit includes a plurality of capacitors connected in series, and a rectifier diode connected to both ends of one of the plurality of capacitors.

The low power supply unit includes a circuit including a capacitor in series with a voltage regulator made from a resistance and a diode, and a rectifier diode connected to both ends of the voltage regulator.

According to an exemplary embodiment the power storage unit may a super capacitor and/or a rechargeable battery.

The switch unit is switched on such that the power storage unit may be charged with a predetermined level of voltage when the level of voltage charged in the power storage unit, and is equal to or below a reference voltage, and is switched off such that a predetermined level of voltage charged in the power storage unit is discharged when the level of voltage charged in the power storage unit exceeds the reference voltage.

In accordance with another aspect of the present invention, an electric power supply apparatus of an electric apparatus includes a main power supply unit, a first switch unit, a low power supply unit, a power storage unit, a voltage detection unit, a second switch unit and a state detection unit. The main power supply unit may be configured to convert a voltage of an input alternating current (AC) power to a main power, which is required to control an operation of the electric apparatus, and to provide the main power. The first switch unit may be configured to allow the input AC power source to be supplied to the main power supply unit or to block the input AC power source from being supplied to the main power supply unit. The low power supply unit may be configured to convert the voltage of the input AC power source and to provide the converted voltage. The power storage unit may be configured to be charged by receiving the converted voltage from the low power supply unit, and to provide the charged power as a standby power of the electric apparatus. The voltage detection unit may be configured to detect a level of voltage charged in the power storage unit. The second switch unit may be configured to allow the voltage of the low power supply unit to be supplied to the power storage unit, or to block the voltage of the low power supply unit from being supplied to the power storage unit according to the level of voltage charged in the power storage unit detected through the voltage detection unit. The state detection unit may be configured to receive the power from the power storage unit to provide the received power to a circuit requiring a standby power, and to perform control such that the AC power source is allowed to be supplied to the main power supply unit, or is blocked from being supplied to the main power supply unit by transmitting a switch-on control signal or a switch-off control signal to the first switch unit according to a control signal that is input from an external part.

The low power supply unit includes a plurality of capacitors connected in series and a rectifier diode connected to both ends of one of the plurality of capacitors.

The low power supply unit includes a circuit including a capacitor in series with a voltage regulator made from a resistance and a diode and a rectifier diode connected to both ends of the voltage regulator.

According to an exemplary embodiment of the present invention, the power storage unit may be a super capacitor and/or a rechargeable battery.

The second switch unit is switched on such that the power storage unit may be charged with a predetermined level of voltage when the level of voltage charged in the power storage unit is equal to or below a reference voltage, and is switched off—such that a predetermined level of voltage charged in the power storage unit is discharged to the state detection unit when the level of voltage charged in the power storage unit exceeds the reference voltage.

The state detection unit includes a signal receiving unit configured to receive the control signal from the external part, a power source control unit configured to allow the AC power source to be supplied to the main power supply unit or to block the AC power source from being supplied to the main power supply unit according to the control signal transmitted from the signal receiving unit, and an abnormal power shut down detection unit configured to determine whether the AC supply power source is blocked due to an abnormal condition.

The blocking of the AC power source due to the abnormal condition represents a case that a plug is pulled out, or a power failure occurs while the electric apparatus is in an operating mode.

The abnormal power shut-down detection unit includes a capacitor configured to provide the abnormal power shut-down detection unit with a power source even when the AC power source is blocked, a freewheeling diode configured to avoid power of the capacity from leaking to outside the abnormal power shut-down detection unit, and a number, for example, two switching elements while each may be configured to control the first switch unit.

One of the switching elements may be a PNP type bipolar junction transistor and another may be a NPN type bipolar junction transistor, wherein a collector of the PNP type bipolar junction transistor is connected to a base of the NPN type bipolar junction transistor. If an electric current is passed through a base of the PNP type bipolar junction transistor, the first switch unit is switched off.

An electric power supply apparatus of an electric apparatus is provided that can avoid power waste by providing a standby power by use of a power storage unit, such as a super capacitor, and by charging the power storage unit, if the voltage of the power storage unit is reduced to a predetermined level by connecting a power source that can provide a small, predetermined amount of power required in the power storage unit such that a minimum amount of standby power is generated.

An electric power supply apparatus of an electric apparatus is provided that can reduce the amount of standby power consumed when an electric apparatus in operation is disconnected from an external power source due to an abnormal condition, and then is recovered.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION OF THE EMBODIMENTS

Figure 1:
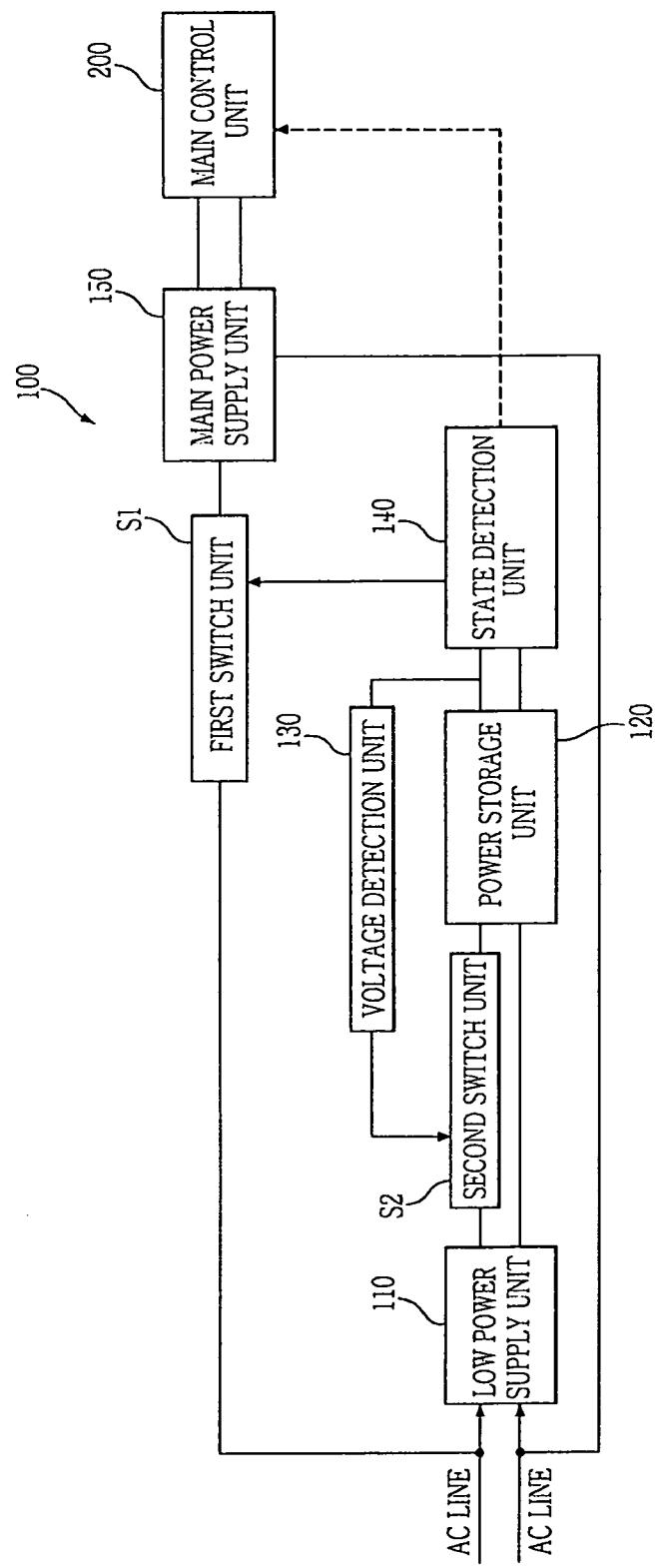
FIG. 1 is a block diagram illustrating an exemplary electric power supply apparatus of an electric apparatus.

Reference will now be made in detail to exemplary embodiments of the present invention, examples of which are illustrated in the accompanying drawings, wherein like reference numerals refer to like elements throughout.

FIG. 1 illustrates an exemplary electric power supply apparatus of an electric apparatus.

Referring to FIG. 1, an electric power supply apparatus 100 of an electric apparatus includes a low power supply unit 110, a power storage unit 120, a voltage detection unit 130, a state detection unit 140, a main power supply unit 150, a first switch unit S1, and a second switch unit S2.

The low power supply unit 110 receives a nominal alternating current (AC) through an AC power source line and provides the power storage unit 120 with a low power that is required in the power storage unit 120. The low power supply unit 110 may be implemented using a circuit, in which a number of, e.g., two capacitors are connected in series and a rectifier diode is connected to both ends of one of the capacitors having a lower voltage applied thereto, or a circuit in which a capacitor, a resistance and a diode are connected in series and a rectifier diode is connected to both ends of a resistance-diode. Since the circuit having the capacitors connected in series provides a voltage distribution for an input AC, if the capacitors have different capacitances, one of the capacitors has a lower voltage applied thereto. If the lower voltage applied to one of the capacitors passes through the rectifier diode, a rectified direct voltage is generated. The rectified direct voltage, which is generated in the low power supply unit 110, is provided to the power storage unit 120.

The power storage unit 120 stores a power that is provided through the low power supply unit 110. The power storage unit 120 may be implemented using a rechargeable battery or a super capacitor. The power storage unit 120 provides the stored power to the state detection unit 140.

The voltage detection unit 130 detects the level of voltage charged in the power storage unit 120, and output a detected voltage level value to the second switch unit S2.

The state detection unit 140 receives a power from the power storage unit 120 and provides the power to a circuit that requires a standby power, for example, a signal reception circuit, which may be configured to receive signals from a remote control or an external power button, or a power control unit circuit. The state detection unit 140 determines when to provide a main control unit 200 with a main power.

Figure 2:
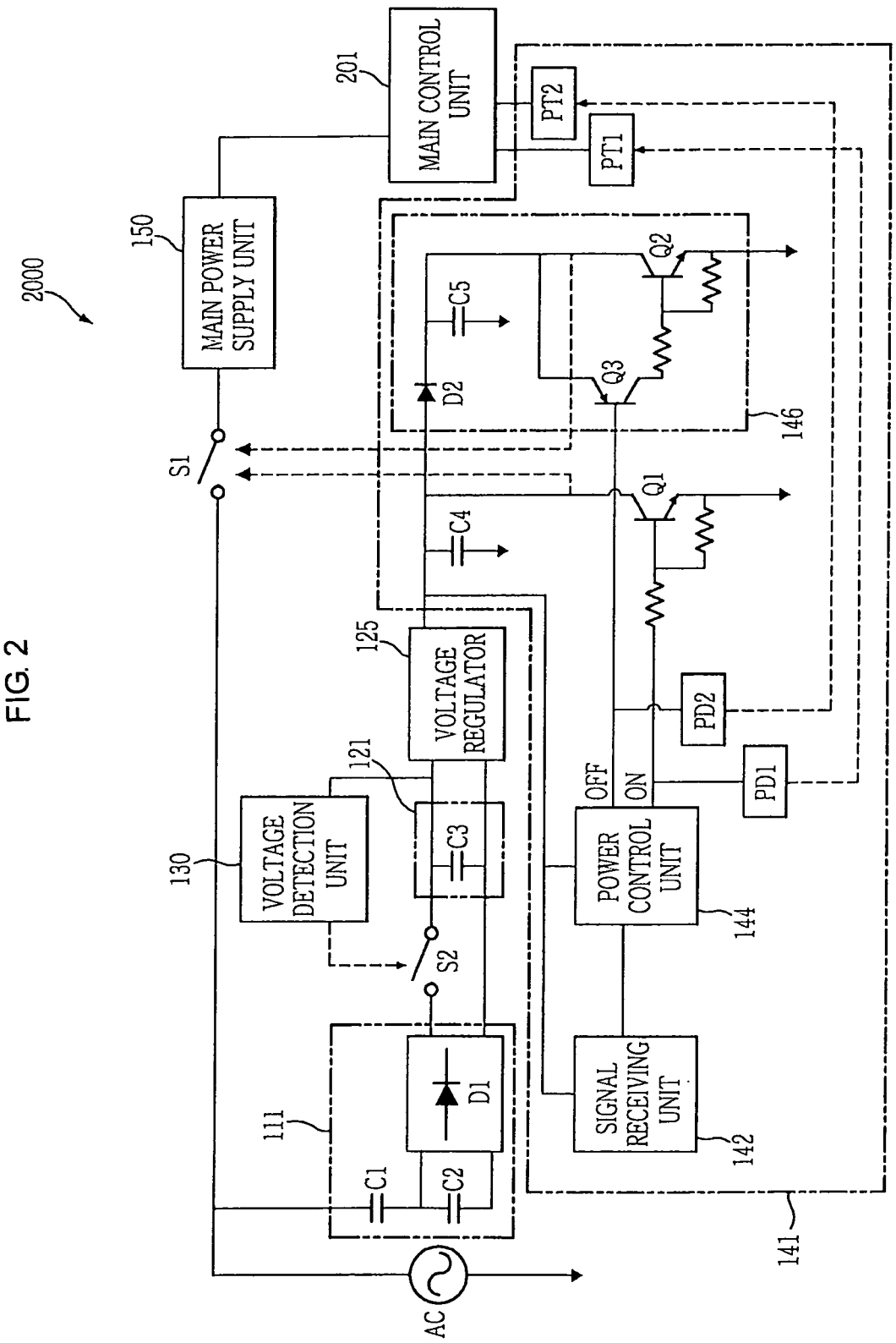
FIG. 2 is a circuit diagram illustrating an exemplary electric power supply apparatus of an electric apparatus.

For example, in a case that the electric apparatus is a television, the state detection unit 140 operates the television by providing power to a remote control signal receiving unit (denoted as 142 in FIG. 2) for a remote control through a remote control and a power control unit (denoted as 144 in FIG. 2). In a case that the electric apparatus is a charger of a mobile phone, if the mobile phone is connected to the charger, the state detection unit 140 determines that the charger is in an operating mode, that is, a charging mode, and performs control such that the first switch unit S1 is switched on to provide a main power. If the mobile phone is separated from the charger, the state detection unit 140 determines that the charger is in a standby mode and performs control such that the first switch unit S1 is switched off to provide a standby power.

That is, upon the determination to an operating mode, that is, a charging mode of the electric apparatus, the state detection unit 140 performs control such that the first switch unit S1 is switched on to provide the main power supply unit 150 with a nominal AC.

The state detection unit 140 may first operate the main power supply unit 150 by turning on the first switch unit S1, and then transmit a signal (see a dotted line in FIG. 1) to the main control unit 200 of the electric apparatus, like in the case that there is a need to notify a main control unit 200 of a television that the television is turned on.

Upon the switch-on state of the first switch unit S1, the main power supply unit 150 receives a commercial AC power source through the first switch unit S1, converts the received commercial AC power source to a main power, which is required in operating the electric apparatus, according to a control signal of the main control unit 200 of the electric apparatus and then provides the main power to the main control unit 200 and to other parts of the electric apparatus. That is, when the electric apparatus is in an operating mode, the main power supply unit 150 provides the main control unit 200 and other parts of the electric apparatus with power. The main power supply unit 140 includes a Switched-Mode Power Supply (SMPS), which switches an alternating current (AC) provided from an external part into a direct current (DC), converts the DC to a voltage satisfying requirements of a respective electric apparatus, and provides the converted voltage. The SMPS serves to provide a constant level of output voltage even if an input voltage is changed.

The first switch unit S1 may be switched on or off according to a control signal of the state detection unit 140 to allow a commercial AC power source to be supplied to the main power supply unit 150, or to block a commercial AC power source from being supplied to the main power supply unit 150. That is, the first switch unit S1 is switched on according to a switch-on control signal transmitted from the state detection unit 140; that is, when the electric device is in an operating mode, a commercial AC power source is allowed to be supplied to the main power supply unit 150. The first switch unit S1 is switched off according to a switch-off control signal transmitted from the state detection unit 140; that is, when the electric device is in a standby mode, a commercial AC power source is blocked from being supplied to the main power supply unit 150. The first switch unit S1 may be implemented using a latching relay.

The second switch unit S2 allows a power of the low power supply unit 110 to be supplied to the power storage unit 120 or blocks a power of the low power supply unit 110 from being supplied to the power storage unit 120 according to the level of power charged in the power storage unit 120 detected through the voltage detection unit 130.

That is, the second switch unit S2 may be set to be switched on or off based on a predetermined reference value. If the level of voltage charged in the power storage unit 120 is equal to or below a reference value, the second switch unit S2 is switched on such that the power storage unit 120 is charged with a predetermined voltage. If the level of voltage charged in the power storage unit 120 exceeds the reference value, the second switch unit S2 is switched off such that a predetermined voltage charged in the power storage unit 120 is discharged to the state detection unit 140. The discharging of the predetermined voltage charged in the power storage unit 120 to the state detection unit 140 represents use of the voltage charged in the power storage unit 120 as standby power.

FIG. 2 illustrates an exemplary electric power supply apparatus of an electric apparatus.

Referring to FIG. 2, an exemplary electric power supply apparatus 2000 includes a circuit configured to provide a standby power in a standby mode of the electric apparatus and a circuit configured to provide a main power in an operating mode of the electric apparatus.

The circuit to provide a standby power in a standby mode of the electric apparatus includes the low power supply unit 111, the power storage unit 121, a voltage regulator 125, the voltage detection unit 130, and the second switch unit S2.

The low power supply unit 111 represents a DC rectifier unit configured to receive a nominal AC, and switches the received AC power source to a DC power source required in the power storage unit 121. The low power supply unit 111 may be implemented by connecting two capacitors C1 and C2 in series and by connecting a rectifier diode D1 to both ends of one of the capacitors C1 and C2. A scheme of distributing voltages by use of the two capacitors C1 and C2, consumes a lower power compared to a scheme of distributing voltages by use of a resistance element, so the power transformation efficiency is enhanced. The scheme of distributing voltages by use of the two capacitors C1 and C2 provides a power, which is required by the power storage unit 121, with a low power. A voltage applied to both ends of the capacitor C2 is changed to a direct voltage by passing through the rectifier diode D1.

A rear end of the low power supply unit 111 is connected to the second switch unit S2, which allows or blocks a connection between the low power supply unit 111 and the power storage unit 121, and to the power storage unit 121, which provides the state detection unit 141 with a power when the second switch unit S2 is in an off state. The power storage unit 121 may be implemented using a super capacitor C3.

The super capacitor C3 stores a power, which is provided through the low power supply unit 111, or provides the stored power to the state detection unit 141. The super capacitor C3 is connected to the voltage detection unit 130 that may be configured to detect the level of voltage charged in the super capacitor C3.

The voltage detection unit 130 detects a voltage level value charged in the super capacitor C3, and outputs the voltage level value to the second switch unit S2.

The second switch unit S2 is switched on or off according to the voltage level value of the super capacitor C3 detected through the voltage detection unit 130 such that the super capacitor C3 is charged with a predetermined voltage or a predetermined voltage charged in the super capacitor C3 is discharged to the state detection unit 141.

If the voltage level value of the super capacitor C3 detected through the voltage detection unit 130 is equal to or below a reference voltage level, the second switch S2 is switched on such that the super capacitor C3 is connected to an external power source and is charged with a predetermined voltage. If the voltage level value of the super capacitor C3 detected through the voltage detection unit 130 exceeds the reference voltage level, the second switch S2 is switched off such that the super capacitor C3 is disconnected from an external power source. Accordingly, a predetermined voltage charged in the super capacitor C3 is discharged to the state detection unit 141. If the super capacitor C3 is charged with a great amount of voltage beyond a reference voltage, the super capacitor C3 provides power required in the state detection unit 141 even if the super capacitor C3 is cut off from an external power source. In this case, since the second switch unit S2 is in an off state, the power consumption of the external power source is minimized.

The voltage regulator 125 is connected to a rear end of the super capacitor C3 to provide a stable voltage. The voltage regulator 125 represents a circuit which may be configured to generate a predetermined target voltage from an input voltage, and includes a comparator, PMOS transistor serving as a driver and resistances serving as a potential divider.

The state detection unit 141 receives a power from the power storage unit 121 and provides a power with a circuit that requires a standby power. The state detection unit 141 determines when to provide a main power to the main control unit 201 of the electric apparatus through the main power supply unit 150. The state detection unit 141 performs control such that a commercial AC power source is supplied to the main power supply unit 150, or is blocked from being supplied to the main power supply unit 150 by transmitting a switch-on control signal or a switch-off control signal to the first switch unit S2 according to a result of the determination.

The state detection unit 141 includes the signal receiving unit 142, the power control unit 144, a first switching element Q1, which has a base connected to an on-signal output port of the power control unit 144 and a collector connected to an output of the voltage regulator 125, and an abnormal power shut-down detection unit 146.

The abnormal power shut-down detection unit 146 includes a freewheeling diode D2 connected to the output of the voltage regulator 125, a capacitor C5 C4 connected between a cathode of the freewheeling diode D2 and a ground, a third switching element Q3, which has a base connected to an off-signal output port of the power control unit 144 and an emitter connected to the cathode of the freewheeling diode D2, and a second switching element Q2, which has a base connected to a collector of the third switching element Q3 and a collector connected to the cathode of the freewheeling diode D2. Each of the first, second, and third switching elements Q1, Q2, and Q3 may be implemented using a bipolar junction transistor (BJT). Each of the first switching element Q1 and the second switching element Q2 are implemented using an NPN-type BJT, and the third switching element Q3 may be implemented using a PNP-type BJT. Output signals of the collectors of the first switching element Q1 and the second switching element Q2 are transmitted to the first switch unit S1. The output signal of the collector of the first switching element Q1 turns on the first switch unit S1, and the output signal of the collector of the second switching element Q2 turns off the first switch unit S1.

The signal receiving unit 142 receives a control signal from an external part, and transmits the received control signal to the power control unit 144. The signal receiving unit 142 receives a device control signal, which is transmitted from a remote control transmitting unit, or a signal of an external power button.

The power control unit 144 performs control such that a commercial AC power source is allowed to be supplied to the main power supply unit 150, or is blocked from being supplied to the main power supply unit 150 according to the control signal that is transmitted from the signal receiving unit 142.

The power control unit 144 receives the control signal from the signal receiving unit 142, decodes the received control signal and transmits a control signal corresponding to the decoded signal to the main control unit 201 of the electric apparatus through photocouplers PD1-PT1 and PD2-PT2 such that the main operation of the electric apparatus is controlled. If a control signal, which is received from the signal receiving unit 142 and decoded through the power control unit 144, is a power-on signal, the main power supply unit 150 needs to connect a commercial AC power source to the main power supply unit 150 such that the electric apparatus is converted from a standby mode to an operating mode. In this case, if an ON signal (High signal) that is output through the on signal output port of the power control unit 144 is input to the base of the first switching element Q1 and to an electrical current passes through the base of the first switching element Q1, an electrical current passes from a collector of the first switching element Q1 to an emitter of the first switching element Q1; so the first switching element Q1 turns on the first switch unit S1, thereby supplying a commercial AC power source to the main power supply unit 150.

If a control signal, which is received from the signal receiving unit 142 and is decoded through the power control unit 144, is a power-off signal, the main power supply unit 150 advantageously disconnect a commercial AC power source supplied from the main power supply unit 150 such that the electric apparatus is converted from an operating mode to a standby mode. In this case, an OFF signal (Low signal) that is output through the off signal output port of the power control unit 144 is input to the base of the third switching element Q3 and thus an electrical current does passes through the base of the third switching element Q3. As a result, an electrical current passes from the emitter of the third switching element Q3 to the collector of the third switching element Q3, and thus an electrical current passes through the base of the second switching element Q2. Therefore, the first switch unit S1 is turned off, so that a commercial AC power source is blocked from being supplied to the main power supply unit 150.

Blocking of an external power source (nominal AC) may occur due to an abnormal condition, in which a plug is pulled out or a power failure occurs in an operating mode, that is, blocking of an external power source may occur without a power-off instruction (signal) received from the power control unit 144. In this case, if an external power source is provided again, e.g., from inserting a plug or recovering the power failure, the first switch unit S1 is in an ON state since the blocking of power failure is made without the power off instruction from the power control unit 144. In this case, the first switch unit S1 is in an ON state and a commercial AC power source is consumed, but the electric apparatus performs a standby mode other than an operating mode.

Upon an external power source being blocked while the electric apparatus is in operating mode and then provided again, the electric apparatus maintains a standby mode while consuming an external power source (nominal AC) other than a standby power that is generated through the components 111, 121, 125, 130 and S2 of the circuit configured to provide the standby power, thereby increasing the amount of standby power consumed in the electric apparatus. In this regard, in order to reduce the amount of standby power provided to the electric apparatus in a standby mode, the first switch unit S1, which may be configured to connect the external power source (nominal AC) to the main power supply unit 150, advantageously switched off when the external power source (nominal AC) is blocked from any unexpected condition.

To reduce the amount of standby power provided to the electric apparatus when an external power source (nominal AC) is recovered from disconnection due to an abnormal condition and the electric apparatus is in a standby mode, this example employs a circuit; that is, the abnormal power shut down detection unit 146 configured to detect a condition that an external power source is blocked (shut down) due to an abnormal condition The abnormal power shut down detection unit 146 includes a capacitor C5, the freewheeling diode D2, the second switching element Q2 and the third switching element Q3. The capacitor Q5 may be configured to instantaneously provide power to the abnormal power shut-down detection unit 146 even if the supply of external power source is blocked. The freewheeling diode D2 may be configured to avoid a power of the capacitor C5 from leaking to other circuits. The second and third switching elements Q2 and Q3 are configured to control the first switch unit S1. The third switching element Q3 is a PNP-type BJT. If an electric current does not pass through the base of the third switching element Q3, that is, a Low signal is input to the base of the third switching element Q3 due to an abrupt blocking of an external power source from an abnormal condition, an electric current passes through from the emitter of the third switching element Q3 to the collector of the third switching element Q3. Accordingly, an electric current passes through the base of the second switching element Q2, thereby switching off the first switch unit S1.

In the operating mode of the electric apparatus, the third switching element Q3 may be controlled such that an electric current passes through the base of the third switching element Q3 to avoid the third switching element Q3 from operating. In a case that a power shut-down signal is input from an external part besides a case that an external power source (nominal AC) is blocked due to an abnormal condition, an electric current does not pass through the base of the third switching element Q3, so that the second and third switching elements Q2 and Q3 operate and thus the first switch unit S1 is switched off. In this case, the power source required to operate the second and third switching elements Q2 and Q3 is provided by the capacitor C5As described above, the abnormal power shut-down detection unit 146 reduces the amount of standby power consumed when an external power source (nominal AC) is recovered from disconnection due to an abnormal condition and the electric apparatus is in a standby mode.

The low power supply unit 111 may be configured to provide the power storage unit 121 with lower power required in the power storage unit 121 by use of a circuit including two capacitors C1 and C2 connected in series. In this example, the low power supply unit 111 of the electric power supply apparatus of the electric apparatus allows a limited level of a power source—for example, 110V or 220V of nominal AC. To connect another level of external power source to the low power supply unit 111, for example, in order to connect a commercial AC power source of 110V when the level of intended commercial AC power source is 220V, a transformer may be used.

Figure 3:
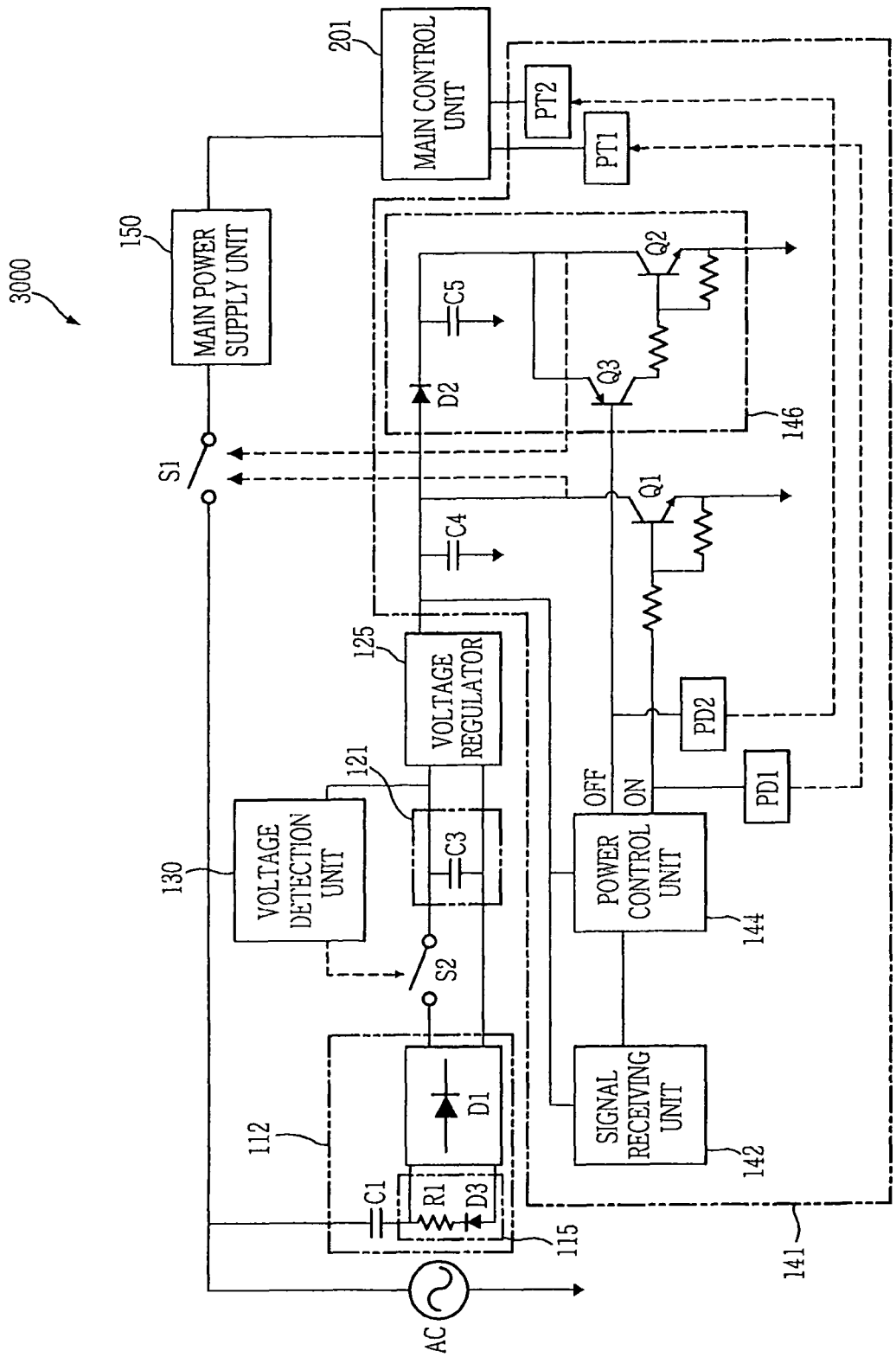
FIG. 3 is a circuit diagram illustrating an exemplary electric power supply apparatus of an electric apparatus.

FIG. 3 illustrates another exemplary embodiment of electric power supply apparatus of an electric apparatus 3000.

A low power supply unit 112 may be implemented using a circuit including a capacitor C1, a resistance element R1 and a diode D3 that are connected to one another in series to provide the power storage unit 121 with a low power required by the power storage unit 121. By use of a voltage regulator 115 including the resistance element R1 and the diode D3, a constant level of voltage can be provided even if an external power source provided to the low power supply unit 112 is changed, thereby removing the inconvenience that a user uses a transformer according to the external power source.

Referring to FIG. 3, other components of the electric power supply apparatus 3000 except for the circuit forming the low power supply unit 112 are substantially identical to those of the electric power supply apparatus 2000 described above with reference to FIG. 2. Accordingly, the details of those are omitted in order to avoid redundancy.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:
1. An electric power supply apparatus of an electric apparatus, the electric power supply apparatus comprising:
  a low power supply unit configured to convert a voltage of an input alternating current (AC) power source and provide the converted voltage;

a power storage unit configured to be charged by receiving the converted voltage from the low power supply unit and to provide the charged power as a standby power of the electric apparatus;

a voltage detection unit configured to detect a level of voltage charged in the power storage unit; and a switch unit configured to allow the voltage of the low power supply unit to be supplied to the power storage unit, or to block the voltage of the low power supply unit from being supplied to the power storage unit according to the level of voltage charged in the power storage unit detected through the voltage detection unit.

2. The electric power supply of claim 1, wherein the low power supply unit comprises:

a plurality of capacitors connected in series; and a rectifier diode connected to both ends of one of the plurality of capacitors.

3. The electric power supply of claim 1, wherein the low power supply unit comprises:

a circuit including a capacitor in series with a voltage regulator made from a resistance and a diode; and a rectifier diode connected to both ends of the voltage regulator.

4. The electric power supply of claim 1, wherein the power storage unit is a super capacitor.

5. The electric power supply of claim 1, wherein the power storage unit is a rechargeable battery.

6. The electric power supply of claim 1, wherein the switch unit is switched on such that the power storage unit is charged with a predetermined level of voltage when the level of voltage charged in the power storage unit, and is equal to or below a reference voltage, and is switched off such that a predetermined level of voltage charged in the power storage unit is discharged when the level of voltage charged in the power storage unit exceeds the reference voltage.

7. An electric power supply apparatus of an electric apparatus, the electric power supply apparatus comprising:

a main power supply unit configured to convert a voltage of an input alternating current (AC) power to a main power, which is required to control an operation of the electric apparatus, and to provide the main power;

a first switch unit configured to allow the input AC power source to be supplied to the main power supply unit or to block the input AC power source from being supplied to the main power supply unit;

a low power supply unit configured to convert the voltage of the input AC power source and to provide the converted voltage;

a power storage unit configured to be charged by receiving the converted voltage from the low power supply unit, and to provide the charged power as a standby power of the electric apparatus;

a voltage detection unit configured to detect a level of voltage charged in the power storage unit;

a second switch unit configured to allow the voltage of the low power supply unit to be supplied to the power storage unit, or to block the voltage of the low power supply unit from being supplied to the power storage unit according to the level of voltage charged in the power storage unit detected through the voltage detection unit; and a state detection unit configured to receive the power from the power storage unit to provide the received power to a circuit requiring a standby power, and to perform control such that the AC power source is allowed to be supplied to the main power supply unit, or is blocked from being supplied to the main power supply unit by transmitting a switch-on control signal or a switch-off control signal to the first switch unit according to a control signal that is input from an external part.

8. The electric power supply of claim 7, wherein the low power supply unit comprises:

a plurality of capacitors connected in series; and a rectifier diode connected to both ends of one of the plurality of capacitors.

9. The electric power supply of claim 7, wherein the low power supply unit comprises:

a circuit including a capacitor in series with a voltage regulator made from a resistance and a diode; and a rectifier diode connected to both ends of the voltage regulator.

10. The electric power supply of claim 7, wherein the power storage unit is a super capacitor.

11. The electric power supply of claim 7, wherein the power storage unit is a rechargeable battery.

12. The electric power supply of claim 7, wherein the second switch unit is switched on such that the power storage unit is charged with a predetermined level of voltage when the level of voltage charged in the power storage unit is equal to or below a reference voltage, and is switched off—such that a predetermined level of voltage charged in the power storage unit is discharged to the state detection unit when the level of voltage charged in the power storage unit exceeds the reference voltage.

13. The electric power supply of claim 7, wherein the state detection unit comprises:

a signal receiving unit configured to receive the control signal from the external part;

a power source control unit configured to allow the AC power source to be supplied to the main power supply unit or to block the AC power source from being supplied to the main power supply unit according to the control signal transmitted from the signal receiving unit; and an abnormal power shut down detection unit configured to determine whether the AC supply power source is blocked due to an abnormal condition.

14. The electric power supply of claim 13, wherein the blocking of the AC power source due to the abnormal condition represents a case that a plug is pulled out, or a power failure occurs while the electric apparatus is in an operating mode.

15. The electric power supply of claim 14, wherein the abnormal power shut-down detection unit comprises:

a capacitor configured to provide the abnormal power shut-down detection unit with a power source even when the AC power source is blocked;

a freewheeling diode configured to prevent power of the capacity from leaking to outside the abnormal power shut-down detection unit; and two switching elements while each may be configured to control the first switch unit.

16. The electric power supply of claim 15, wherein one of the two switching elements is a PNP type bipolar junction transistor and a remaining is an NPN type bipolar junction transistor, wherein a collector of the PNP type bipolar junction transistor is connected to a base of the NPN type bipolar junction transistor, and wherein if an electric current is passed through a base of the PNP type bipolar junction transistor, the first switch unit is switched off.

* * * * *